(12) United States Patent
Lassmann et al.

(10) Patent No.: US 9,107,295 B2
(45) Date of Patent: Aug. 11, 2015

(54) MULTILAYER PRINTED CIRCUIT BOARD AND DEVICE COMPRISING THE SAME

(71) Applicants: Wilfried Lassmann, Hirschau (DE); Christian Büttner, Pegnitz (DE)

(72) Inventors: Wilfried Lassmann, Hirschau (DE); Christian Büttner, Pegnitz (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 339 days.

(21) Appl. No.: 13/709,964

(22) Filed: Dec. 10, 2012

(65) Prior Publication Data

US 2013/0146352 A1    Jun. 13, 2013

(30) Foreign Application Priority Data

Dec. 12, 2011  (DE) .......................... 10 2011 088 256

(51) Int. Cl.
| | |
|---|---|
| *H05K 5/00* | (2006.01) |
| *H05K 1/02* | (2006.01) |
| *H05K 3/00* | (2006.01) |

(52) U.S. Cl.
CPC ............ *H05K 1/0201* (2013.01); *H05K 1/0206* (2013.01); *H05K 3/0061* (2013.01); *H05K 5/0026* (2013.01)

(58) Field of Classification Search
CPC . H05K 1/0201; H05K 3/0061; H05K 1/0206; H05K 5/0026
See application file for complete search history.

(56) References Cited

U.S. PATENT DOCUMENTS

| | | | | | |
|---|---|---|---|---|---|
| 5,467,253 | A | * | 11/1995 | Heckman et al. .............. | 361/761 |
| 5,468,909 | A | * | 11/1995 | Schonberger et al. ........ | 174/16.1 |
| 5,475,263 | A | * | 12/1995 | Coady et al. .................. | 257/700 |
| 5,751,063 | A | * | 5/1998 | Baba ............................. | 257/723 |
| 6,163,456 | A | * | 12/2000 | Suzuki et al. .................. | 361/704 |
| 6,207,354 | B1 | * | 3/2001 | Bhatt et al. .................... | 430/313 |
| 6,212,071 | B1 | * | 4/2001 | Roessler et al. .............. | 361/704 |
| 6,229,702 | B1 | * | 5/2001 | Tao et al. ....................... | 361/704 |
| 6,381,838 | B1 | * | 5/2002 | Ahn et al. ....................... | 29/848 |
| 6,449,168 | B1 | * | 9/2002 | Soderholm .................... | 361/761 |
| 6,538,878 | B1 | * | 3/2003 | Acker et al. ................... | 361/624 |
| 6,797,880 | B2 | * | 9/2004 | Kirchberger et al. .......... | 174/548 |
| 6,797,890 | B2 | * | 9/2004 | Okubora et al. ............... | 174/260 |
| 6,943,293 | B1 | * | 9/2005 | Jeter et al. ...................... | 174/548 |
| 7,180,173 | B2 | * | 2/2007 | Kuo et al. ....................... | 257/706 |
| 7,272,015 | B2 | * | 9/2007 | Karrer et al. ................... | 361/790 |
| 7,339,266 | B2 | * | 3/2008 | Colbert et al. ................. | 257/706 |
| 7,359,204 | B1 | * | 4/2008 | Jang et al. ...................... | 361/715 |
| 7,537,964 | B2 | * | 5/2009 | Minervini ....................... | 438/113 |

(Continued)

FOREIGN PATENT DOCUMENTS

| | | |
|---|---|---|
| DE | 93 00 864 U1 | 5/1994 |
| DE | 197 23 409 A1 | 12/1998 |

(Continued)

OTHER PUBLICATIONS

German Search Report issued in German patent application No. 10 2011 088 256.1, dated Jul. 20, 2012 (7 pages, including translation).

*Primary Examiner* — David M Sinclair
*Assistant Examiner* — Robert Brown
(74) *Attorney, Agent, or Firm* — Brinks Gilson & Lione

(57) ABSTRACT

A multilayer printed circuit board may comprise at least one printed circuit board front end that is thermally conductively metalized. An apparatus with such a printed circuit board is also proposed.

19 Claims, 4 Drawing Sheets

(56) References Cited

U.S. PATENT DOCUMENTS

| | | | |
|---|---|---|---|
| 2001/0042637 A1* | 11/2001 | Hirose et al. | 174/255 |
| 2002/0012234 A1* | 1/2002 | Harada et al. | 361/778 |
| 2004/0100778 A1* | 5/2004 | Vinciarelli et al. | 361/760 |
| 2004/0218372 A1* | 11/2004 | Hamasaki et al. | 361/767 |
| 2004/0233642 A1* | 11/2004 | Ito et al. | 361/720 |
| 2005/0157477 A1* | 7/2005 | Kuramochi et al. | 361/761 |
| 2005/0281007 A1* | 12/2005 | Ireland et al. | 361/748 |
| 2006/0012967 A1* | 1/2006 | Asai et al. | 361/764 |
| 2006/0050493 A1* | 3/2006 | Hamasaki et al. | 361/767 |
| 2006/0065432 A1* | 3/2006 | Kawauchi et al. | 174/254 |
| 2006/0139893 A1* | 6/2006 | Yoshimura et al. | 361/735 |
| 2007/0114058 A1* | 5/2007 | Tsukahara et al. | 174/260 |
| 2007/0158101 A1* | 7/2007 | Chikagawa et al. | 174/260 |
| 2007/0176613 A1* | 8/2007 | Ogawa et al. | 324/754 |
| 2007/0210392 A1* | 9/2007 | Sakakibara et al. | 257/414 |
| 2007/0267740 A1* | 11/2007 | Khan et al. | 257/712 |
| 2008/0007925 A1* | 1/2008 | Kariya et al. | 361/760 |
| 2008/0099911 A1* | 5/2008 | Machida | 257/723 |
| 2008/0148559 A1* | 6/2008 | Nickerson et al. | 29/832 |
| 2008/0157327 A1* | 7/2008 | Yang | 257/686 |
| 2008/0186682 A1* | 8/2008 | Sugimura | 361/720 |
| 2008/0204998 A1* | 8/2008 | Matsui | 361/695 |
| 2009/0084596 A1* | 4/2009 | Inoue et al. | 174/261 |
| 2009/0086461 A1* | 4/2009 | Lee | 361/816 |
| 2009/0129037 A1* | 5/2009 | Yoshino | 361/761 |
| 2009/0244865 A1* | 10/2009 | Tanaka | 361/764 |
| 2009/0296360 A1* | 12/2009 | Doblar et al. | 361/767 |
| 2009/0296361 A1* | 12/2009 | Huang et al. | 361/783 |
| 2010/0091464 A1* | 4/2010 | Ohnishi et al. | 361/723 |
| 2010/0133001 A1* | 6/2010 | Loibl et al. | 174/521 |
| 2010/0195291 A1* | 8/2010 | Kimura et al. | 361/748 |
| 2010/0226102 A1* | 9/2010 | So et al. | 361/748 |
| 2010/0263915 A1* | 10/2010 | Shiraiwa et al. | 174/252 |
| 2010/0288535 A1* | 11/2010 | Hong et al. | 174/252 |
| 2010/0328903 A1* | 12/2010 | Nagaike | 361/748 |
| 2011/0063805 A1* | 3/2011 | Kim | 361/743 |
| 2011/0088936 A1* | 4/2011 | Schaaf et al. | 174/260 |
| 2011/0151626 A1* | 6/2011 | Lin et al. | 438/118 |
| 2011/0203839 A1* | 8/2011 | Iwamoto | 174/260 |
| 2011/0278638 A1* | 11/2011 | Lin et al. | 257/99 |
| 2012/0000699 A1* | 1/2012 | Inoue | 174/257 |
| 2012/0020028 A1* | 1/2012 | Bachman et al. | 361/719 |
| 2012/0044656 A1* | 2/2012 | Lu et al. | 361/748 |
| 2012/0063093 A1* | 3/2012 | Meinel et al. | 361/707 |
| 2012/0075808 A1* | 3/2012 | Lee et al. | 361/720 |
| 2012/0300412 A1* | 11/2012 | Song et al. | 361/728 |
| 2012/0314390 A1* | 12/2012 | Chang | 361/761 |
| 2013/0168136 A1* | 7/2013 | Inaba et al. | 174/252 |

FOREIGN PATENT DOCUMENTS

| | | |
|---|---|---|
| DE | 10 2006 004 320 A1 | 8/2007 |
| DE | 10 2007 019 098 A1 | 11/2008 |
| DE | 10 2009 060 123 A1 | 6/2011 |

* cited by examiner

MULTILAYER PRINTED CIRCUIT BOARD AND DEVICE COMPRISING THE SAME

PRIORITY STATEMENT

This application claims the benefit of Germany Patent Application No. DE 10 2011 088 256.1, filed on Dec. 12, 2011, the disclosure of which is incorporated herein in its entirety by reference.

BACKGROUND

The present invention relates to a multilayer printed circuit and an arrangement with such a multilayer printed circuit board.

Conventional multilayer printed circuit boards are made of several bonding layers, such as ground, signal and supply layers for complex, highly integrated circuits. The printed circuit board material is preferably an epoxy resin-based substrate, in particular FR4, which makes possible a cost-effective printed circuit board production.

The use of FR4 multilayer printed circuit boards is problematic when the application environments require printed circuit boards with high temperature resistance. In such environments, ceramic printed circuit boards may be used. However, ceramic printed circuit boards cost more per piece and require expensive bonding technology.

DE 10 2009 060 123 A1 provides a solution of heat dissipation on printed circuit boards by conducting heat from electric components mounted on a printed circuit board to a cooling region. In addition, DE 10 20070 19 098 A1 and DE 197 23 409 A1 are also known for providing solutions of heat conduction.

SUMMARY

The present application addresses the problem for overcoming the foregoing described disadvantages of the conventional printed circuit boards and proposes a cost-effective, manufacturable, improved multilayer printed circuit board that may be cooled, and also proposes an arrangement formed therewith.

In accordance with the present application a multilayer printed circuit board is proposed, in particular a multilayer printed circuit board which may be formed by means of several printed circuit board substrate layers, wherein preferably an epoxy resin-based substrate, in particular FR4 may be provided as a substrate. Conducting paths and/or conductor surfaces may be formed on the substrate layers, in particular in the form of electrically conductive layers, in particular ground, supply and signal layers, which may be suitably insulated from one another by the substrate. Within the scope of the present invention the term "multilayer printed circuit board" may comprise an assembled printed circuit board, in particular also HDI printed circuit boards. Through connections between individual conducting paths or conductor surfaces of different layers may also be provided in inherently known manner.

The multilayer printed circuit board may include a first surface and a second surface in particular extending over the entire area formed in the stacking direction of the printed circuit board layer stack at opposing ends, as well as an edge or edge region which defines printed circuit board front ends in directions transverse to the stacking direction of the printed circuit board. The first and the second planar surfaces may be arranged planes parallel to one another, while the in particular relatively narrow front ends may be aligned extending transversely to the same.

In order to create a significantly improved multilayer printed circuit board that can be cooled in accordance with the present application, at least one printed circuit board front end of the multilayer printed circuit board may be thermally conductively metalized. According to an example embodiment, all front ends of the printed circuit board may be thermally conductively metalized. As a result of this the front ends may be advantageously actively used for cooling the printed circuit board, preferably for thermally conductive connection to a cooling body, in particular to a housing. In this connection provision may be made to coat the front ends metalized, in particular coppering plating may be used to metalize the front ends, i.e., as edge copper plating. Preferably the respective thermally conductive metalized front ends are formed metalized all over, in particular on all front ends.

For improved cooling of the multilayer printed circuit board within the scope of the present application the multilayer printed circuit board may be constructed in such a way that heat may be transferred from the printed circuit board to the at least one thermally conductive metalized front end. To this end at least one planar, thermally conductive metal layer, e.g., a copper layer, may be provided in the printed circuit board, at which the at least one front end metalized surface may be thermally conductively contacted. Preferably a metalized front end may be thermally conductively coupled to several heat conductible layers in particular of equal electric potential.

Within the scope of the present application a plurality of vias may be formed in the printed circuit board at the at least one printed circuit board edge, at which a thermally conductive metalized printed circuit board edge front end may be formed, and the plurality of vias may thermally and/or conductively contact the metalized front end. Such vias formed on the edge in this connection may act as thermal vias, i.e., thermally conducting heat.

By means of the edge vias, in particular through the suitable grouping of the same, the heat may be advantageously channeled at the at least one printed circuit board edge, in particular the heat may be guided and/or channeled to the printed circuit board edge. In this connection it is pointed out that a channeling may be supported by additional vias, which may be constructed in an interior region of the printed circuit board, wherein these vias, together with the vias constructed in the edge region form a channel from the interior region of the printed circuit board to the edge of the printed circuit board.

This in particular provided that through the vias a high heat dissipation capacity may be provided which may be suitable for the formation of a great temperature delta. A respective thermally conductive channel may extend in this connection in particular from a heat source at the printed circuit board to the metalized coated edge or the front end at which such edge vias may be arranged. Exclusively vias in the form of the edge vias may be provided for the formation of such heat conducting channels. In the case of a further preferred embodiment along with these vias, intermediate vias may be are arranged between a heat source on the printed circuit board and the edge vias to contribute to channeling of the heat flows, i.e., the intermediate vias may act as thermal vias.

The edge vias may be vias, which are implemented in the edge region of the printed circuit board, but still within the printed circuit board. On the other hand they may also be vias which are implemented on the perimeter of the printed circuit board and form a kind of notch along the perimeter. In the process the vias may be constructed in such a way that they either completely penetrate the printed circuit board or only partially penetrate it.

Preferably a plurality of such heat conducting channels may be formed on the printed circuit board extending from a heat source at the printed circuit board to at least one front end, in particular to different front ends, additionally in particular to all metalized front ends. Through such a thermal spreading in particular hot spots in the printed circuit board as well as thermal stress may be advantageously prevented.

Preferably the printed circuit board within the scope of the present invention may further includes routing channels in addition to heat conducting channels, i.e., a structure that de-concentrates heat current and electric current. While the routing channels may be provided for the routing of electrical flows, e.g., for signal routing, supply routing etc., the heat conducting channels may rout the heat flows, i.e., for the purpose of cooling the printed circuit board at the printed circuit board edge. Heat conducting channels and routing channels may preferably be arranged on the printed circuit board in an alternative way, i.e., surrounding or encompassing the heat source at least over a section so that the printed circuit board may be cooled uniformly. Routing channels may be formed by means of the bundling of conductor structures, in particular extending over several printed circuit board layers.

The heat source at the printed circuit board may be a semiconductor or a power component, in particular such that the heat source may be arranged at a planar surface, e.g., the first or the second surface.

In accordance with one example embodiment of the present application, the edge vias, also referred to as vias implemented within the edge region of the printed circuit board may be formed or arranged adjacent to the metalized front end on the edge of the printed circuit board, i.e., at a distance to the metalized front end, e.g., in the region of 1 mm to 2 mm to the printed circuit board front end, wherein the edge vias may be coupled thermally conductively to the metalized front end, e.g., via one or more thermally conductive printed circuit board layers. It is pointed out here that these edge vias may be constructed within the printed circuit board. In contrast to the edge vias described in the following, the interior surfaces of these vias may or may not be part of the metalized front end.

The vias constructed within the edge region of the printed circuit board may exhibit either a metalized, e.g. copper-plated, interior jacket surface or they may be completely filled with metal, e.g., with copper.

Expediently, these vias arranged on the edge may form a closed curve on the printed circuit board, expediently around the heat generating heat source. As a result of this a penetration of exterior magnetic fields may be achieved, a sort of Faraday cage may be formed for the printed circuit board.

In the case of one example embodiment, each lateral surface of a via formed on the edge, in particular of an inner surface, may form a part of a metalized front end. In order in particular to provide the greatest possible surface, in this connection in particular provision may be made that the edge vias are opened to the respective front end, that is, in particular over their length in the stacking direction. The edge vias extend trough-shaped or channel-shaped in the stacking direction, wherein their likewise thermally conductive metalized inner surface may form a part of the front end. In this connection different via cross-sections may be conceivable. It is pointed out here that these edge vias may be implemented on the perimeter of the printed circuit board.

Within the scope of the present application, provision may be made that the edge vias or the through connections may extend through the multilayer printed circuit board, that is, contacting in the stacking direction of the layer stack, in particular at at least one or a plurality of printed circuit board layers, in particular metalized layers. Provision in particular may be made of a cooling of the printed circuit board in such a way that heat can be transferred by means of the edge vias of the first surface to the second surface. However, it is also conceivable to have the edge vias formed only over a section of the multilayer printed circuit board in the direction of the layer stack. Preferably the edge vias in the printed circuit board may also exhibit open ends in the stacking direction. A cutting method may be provided for manufacturing the edge vias, for example boring, or a non-cutting method, for example laser cutting.

Preferably provision is made that the edge vias at a thermally conductive metalized front end may be arranged in groups, in particular in groups spaced apart from one another, wherein vias are arranged to groups on the edge next to one another along the front end or along the printed circuit board. As a result of this, along with a thermal compensation, in particular a channeling of the heat transfer in the printed circuit board may be managed. For example, at least one and/or at most six vias may be provided in series per group.

Within the scope of the present application an arrangement with a housing body as well as the multilayer printed circuit board described in the foregoing is also proposed, wherein the multilayer printed circuit board may be arranged in or on the housing body. In this connection a thermally conductive filler may be arranged between a thermally conductive metalized front end of the multilayer printed circuit board and the housing body, particular heat sink paste. In this way the housing body may be advantageously coupled thermally conductively to the at least one metalized front end.

The housing body may be an aluminum die cast body, in general preferably a metallic, thermally conductive body. The housing body may be provided as a heat sink at which waste heat from the multilayer printed circuit board may be emitted via the at least one metalized front end. This arrangement, may advantageously make possible a good cooling of the multilayer printed circuit board via its thermally conductive metalized front end or edge ends due to a good thermal coupling to the housing body via the filler as well as the opportunity to provide an enlarged surface at the printed circuit board front ends by means of edge vias.

Within the scope of the present application provision may be made that the edge vias arranged at the thermally conductive metalized front end may be likewise filled with the thermally conductive filler, in particular contacted to the housing body via the thermal filler. In this way the enlarged surface, which is available in the form of the inner surface of the edge vias, may be advantageously used for thermal coupling.

In order in particular to prevent an escape of filler from an open end of a via filled with the thermally conductive filler into the component region of the printed circuit board provision may be made that the open end is covered by a pressing element in particular fixed on the housing body, in particular by a binder. This may likewise act in a thermally conductive manner.

By means of the multilayer printed circuit board as well as the proposed arrangement, e.g., a controller, in particular for a motor vehicle, additionally in particular a transmission control device may be formed in particular, said controller or transmission control device advantageously being able to be cooled.

Additional features and advantages of the present application may arise from the following description of example embodiments with the aid of the figures of the drawings, which show details essential to the invention, and from the claims. The individual features may each be realized individually for themselves or with several in random combination in the case of a variant of the invention.

Preferred embodiments of the invention will be described more closely in the following with the aid of the attached drawings. The figures show the following:

DETAILED DESCRIPTION OF EXAMPLE EMBODIMENTS

In the following descriptions identical elements or functions are furnished with identical reference numbers.

Figure 1:
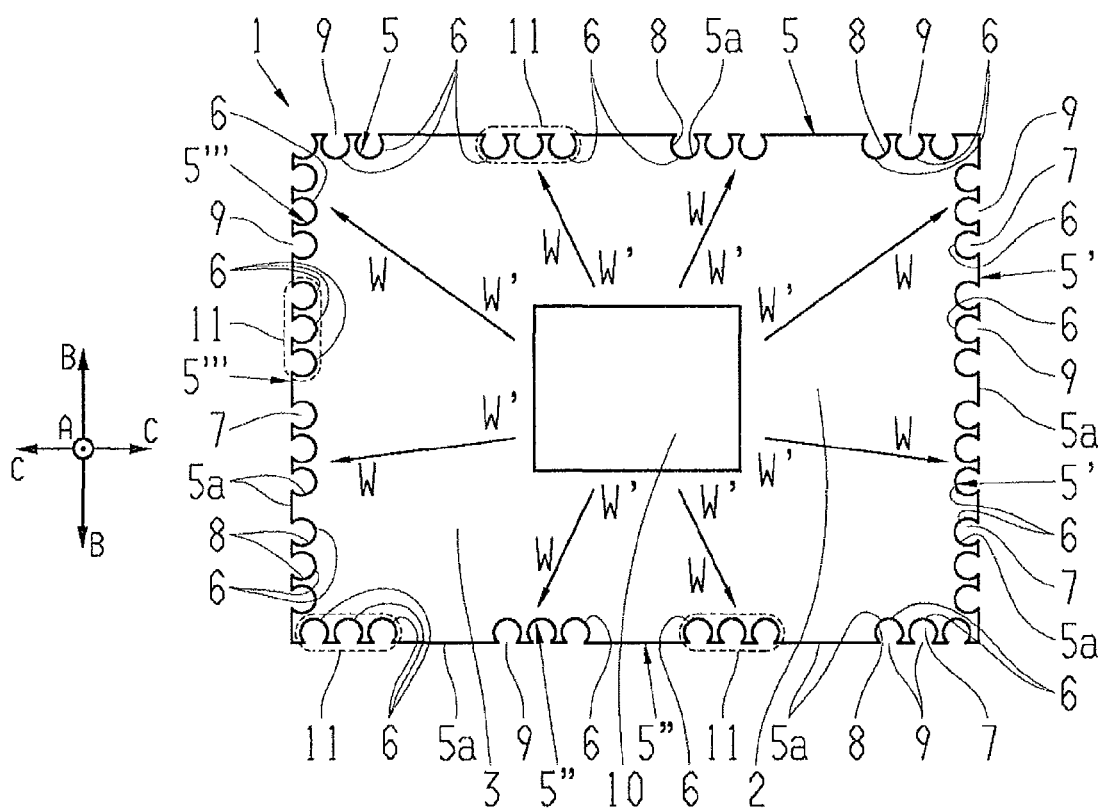
FIG. 1 schematically shows a multilayer printed circuit board in top view in accordance with one example embodiment of the present application.
Figure 3:
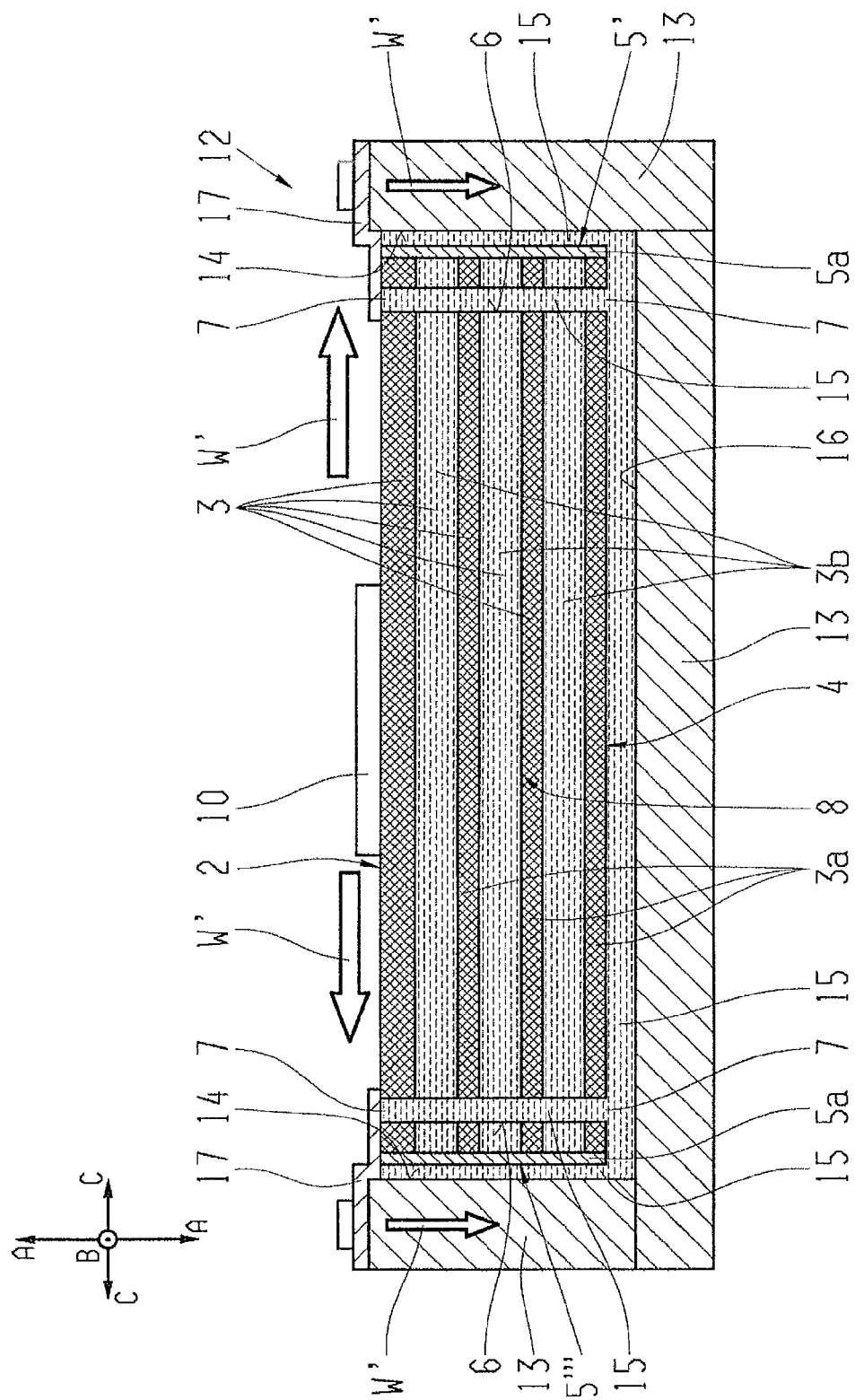
FIG. 3 schematically shows an arrangement with a multilayer printed circuit board as well as a housing body in sectional view in accordance with an example embodiment of the present application.

FIG. 1 schematically shows a multilayer printed circuit board 1 in top view, wherein a first planar printed circuit board surface 2 may form a top side of the printed circuit board 1. A cross section of the multilayer printed circuit board 1 may also be shown in FIG. 3. The multilayer printed circuit board 1 may be formed as an FR4 printed circuit board with several printed circuit board layers 3 arranged one above another or stacked. In particular, the multilayer printed circuit board layers 3 may be formed with multiple ground and/or signal layers 3a and multiple substrate layers 3b being alternatively arranged one over the other, as shown in FIG. 3. A second planar surface 4 may be an underside of the printed circuit board 1, which is similar to the first surface 2. The planar surface 4 may be an external surface in stacking direction A of the layer stack of the multilayer printed circuit board 1. Further, the multilayer printed circuit board 1 may also include front ends 5, 5', 5", 5'", each of which is formed on the edge of the multilayer printed circuit board 1, i.e., in directions B, C transverse to the stacking direction A. The edge may be a lateral surface of the multilayer printed circuit board.

The front ends 5, 5', 5", 5'" on the multilayer printed circuit board may be thermally conductive metalized, e.g., copperplated, so that advantageously a good thermal coupling to an external heat sink may be achieved. The front ends 5, 5', 5", 5'" may be metalized by the application of a metal coating 5a in the process of the printed circuit board production over the respective entire front end 5, 5', 5", 5'", i.e., over the entire surfaces of the front end 5, 5', 5", 5'". Along with copper plating, other metallization, e.g., silver plating, may also be provided.

The respective metalized front ends 5, 5', 5", and/or 5'" may be thermally coupled to several thermally conductive printed circuit board layers 3a, e.g., ground layers 3a, of the printed circuit board 1 by cohesive connection, e.g., via metallization 5a of the front ends 5, 5', 5", 5'". To this end, the ground layers 3a may be conducted to the respective edge (e.g., lateral surface) of the printed circuit board 1.

The multilayer printed circuit board 1 may also include a plurality of edge vias or through connections 6, which may be formed on the edge of the printed circuit board 1, i.e., edge vias 6 may be formed on all edges of the printed circuit board 1. The edge vias 6 may provide a high heat dissipation capacity connected with the thermally conductive front ends 5, 5', 5", 5'".

The edge vias 6 may extend in stacking direction A (a direction that is perpendicular to the first surface 2) of the printed circuit board 1 from the first surface 2 to the second surface 4, wherein the edge vias 6 may include an open end 7 on both sides thereof (i.e., along both directions of the direction A). Further the edge vias 6 may also include in the stacking direction A an essentially hollow cylindrical/rectangular column lateral surface and/or inner surface 8, which, as a result, an opening 9 on the respective edge may form over the length of the edge vias 6 in stacking direction A apart of the thermally conductive metalized front ends 5, 5', 5", 5'". In this connection the inner surface 8 may be likewise thermally conductive or formed by means of a metal coating 5a. The metalized inner surface 8 may be in this connection preferably cohesively connected to the adjacent section of the front ends 5, 5' 5", 5'", which is formed between adjacent edge vias 6, thus thermally coupled to the front ends 5, 5' 5", 5'". The trough-shaped edge vias 6 thus formed thus may advantageously make available an enlarged surface for heat dissipation vis-à-vis a plane front end 5, 5', 5", 5'".

The edge vias 6 may be likewise thermally coupled to a plurality of thermally conductive printed circuit board layers 3a, in particular in such a way that a heat transfer may take place via the edge vias 6 from the first surface 2 to the second surface 4. The edge vias 6 may be thermally coupled to the ground layers 3a via a cohesive connection to the same via the metal plating 5a.

Via an advantageously low thermal transfer resistance of the metalized front ends 5, 5', 5", 5'" formed by means of the edge vias 6, a great quantity of heat from a heat source 10 on the first surface 2 of the printed circuit board 1, such as a microcontroller, a microprocessor, or a power semiconductor, may be dissipated to an external heat sink, wherein the heat from the heat source 10 to the edge regions or the metalized front ends 5, 5', 5", 5'" of the printed circuit board 1 may be transported via the thermally conductive layers 3a of the printed circuit board 1. Via the metalized front ends 5, 5', 5", 5'", in particular via the surface 5, 5', 5", 5'" enlarged by means of the edge vias 6, the heat may additionally be advantageously distributed in stacking direction A and hence additionally faster dissipated.

According to FIG. 1, edge vias 6 arranged on a thermally conductive front end 5, 5', 5", 5'" may further be arranged in groups 11, particular in groups 11 spaced apart from one another, wherein each edge vias 6 may be assigned to a group 11 next to one another along the respective front end 5, 5', 5", 5'" or of the edge. Through the provision of such via groups 11 a purposeful heat distribution and a formation of heat conducting channels W may be achieved. As a result, expansion of heat flows W' by means of the heat conducting channels W may be formed (see e.g., arrows in FIGS. 1 and 2), so that thermal stress in the multilayer printed circuit board 1 is reduced.

Figure 2:
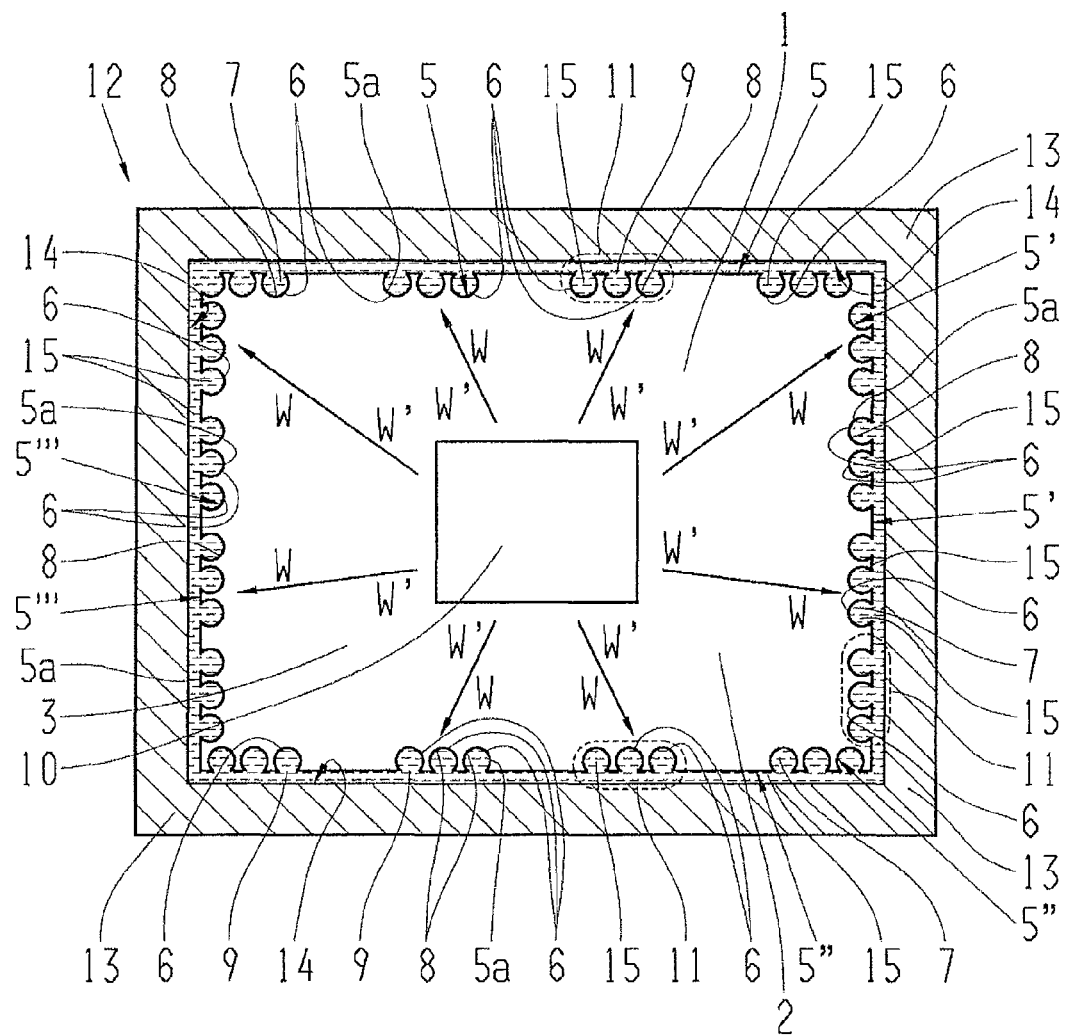
FIG. 2 schematically shows an arrangement with a multilayer printed circuit board in accordance with FIG. 1 as well as a housing body in top view in accordance with an example embodiment of the present application.

FIG. 2 schematically shows a top view of an arrangement 12 with a multilayer printed circuit board 1 as described in the foregoing as well as a thermally conductive housing body 13, according to an example embodiment. The housing body 13 may be formed hollow as a metal (e.g., aluminum) die cast body and may be provided for the purpose of dissipating heat from the multilayer printed circuit board 1. The housing body 13 in this connection may enclose the multilayer printed circuit board 1 with corresponding surfaces on the edge, i.e., adjacent to the thermally conductive metalized front ends 5, 5', 5", 5'", wherein between the housing body 13 or its faces 14 and the multilayer printed circuit board 1 or its front ends 5, 5', 5", 5'" a filler 15 may be arranged in the form of heat sink paste for thermal coupling of the same. As shown in FIG. 2, the opening 9 of the edge vias 6 may also be filled with the heat sink paste 15.

The printed circuit board 1 may be arranged in the housing body 13 in such a way that the second surface 4 is arranged adjacent to and extends together with a planar housing body surface 16, wherein between these surfaces 4, 16 a filler 15 maybe arranged in the form of heat sink paste (also shown in FIG. 3). Thus, heat may be emitted via the open-ended edge vias 6 or the metalized front ends 5, 5', 5", 5'" as well as via the second surface 4 (through the surface 16) via the thermal filler 15 in thermally conductive manner to the housing body 13.

FIG. 3 shows an arrangement 12, which is formed by means of a multilayer printed circuit board 1 as well as a housing body 13, according to an example embodiment. In contrast to the previously described arrangement 12 in FIG. 2, wherein the printed circuit board 1 may include vias 6 arranged on the edge, the edge vias 6 in FIG. 3 may be formed at a distance from a respective adjacent metalized front end 5, 5', 5", 5'". The edge vias 6 may extend in a thermally conductive manner in the stacking direction A (e.g., a direction that is perpendicular to the first surface 2) and connect to the thermally conductive printed circuit board layers 3a, making possible a good cooling of the printed circuit board 1. Accordingly, an enlarged front end 5 may not be provided by the edge vias 6.

Further, an open end 7 of an edge via 6 arranged near the edge may be covered by a pressing element 17 (e.g., a binder) which on the one hand permanently gets hold of the multilayer printed circuit board 1 within the housing body 13 and on the other hand prevents an escape of heat sink paste 15 to the first surface 2, i.e., the surface 2 is assembled with at least one component heat source 10. In addition heat is dissipated via the binder 17 from the open-ended edge vias 6 to the housing body 13.

Figure 4:
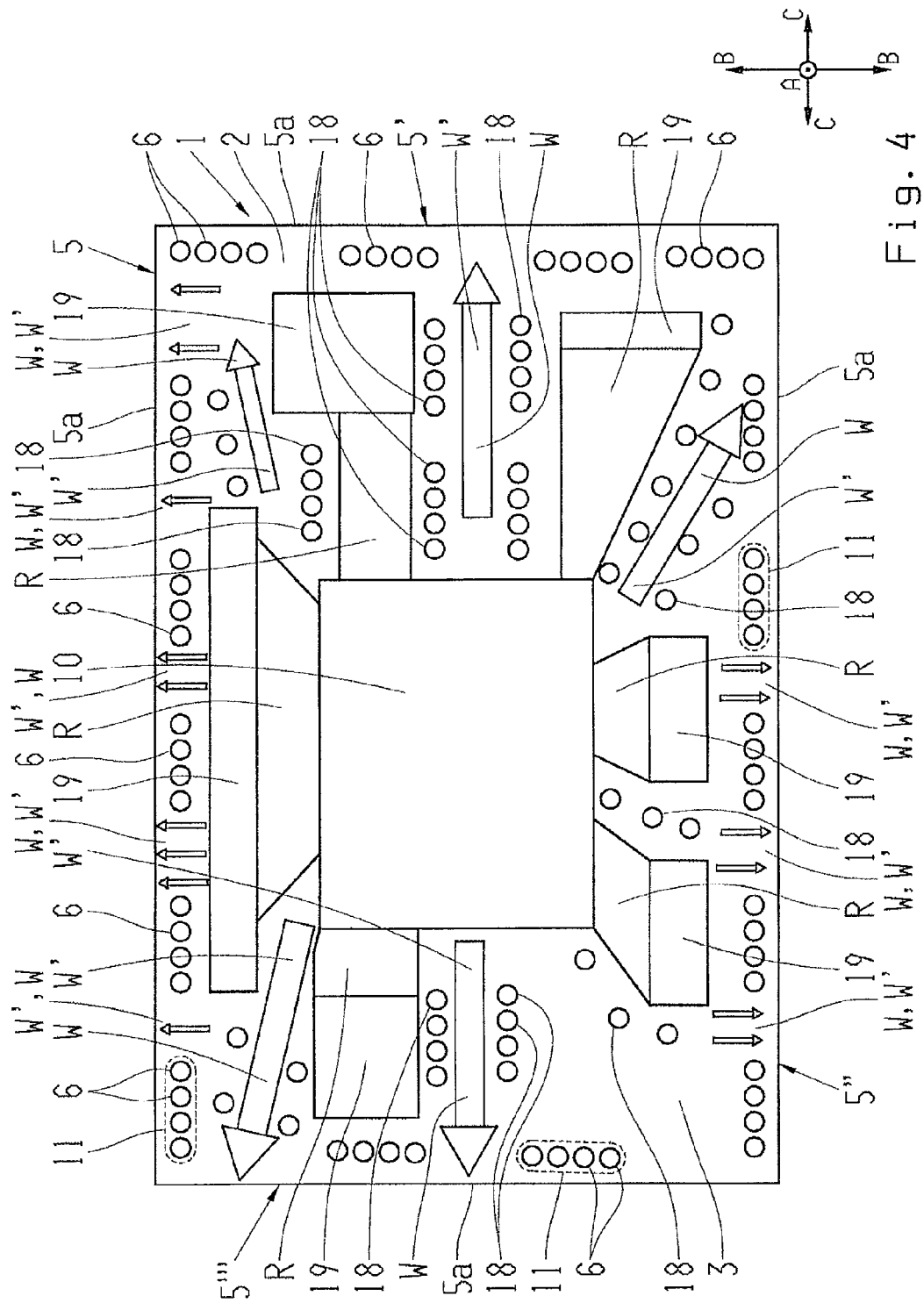
FIG. 4 schematically shows a multilayer printed circuit board with routing and heat conducting channels in accordance with an example embodiment of the present application.

FIG. 4 illustrates an arrangement of heat conducting channels W and routing channels R in a multilayer printed circuit board 1, according to an example embodiment of the present application. Said arrangement is shown in top view.

For the formation of heat conducting channels W, which may be formed by means of the edge vias 6 as well as the thermally conductive layers 3a, such as those shown in FIG. 3, the printed circuit board 1 may include, in addition to the edge vias 6, intermediate vias 18 which may be arranged between the edge vias 6 and the heat source 10, e.g., in the form of channels.

The additional intermediate vias 18 may act as thermal vias and provide a high heat dissipation capacity for the formation of a respective heat conducting channel W, for which purpose said vias 6 and/or 18 may be suitably contacted in thermally conductive manner to one or more thermally conductive printed circuit board layers 3a, which may be coupled to at least one thermally conductive metalized front end 5, 5', 5", 5'".

According to FIG. 4, the multilayer printed circuit board 1 may include an advantageously de-concentrated structure in which case the routing channels R may be advantageously formed separately or to a great extent uninfluenced by the heat conducting channels W (see arrows in FIG. 4). In particular, an overlapping of heat conducting channels W and routing channels R may be prevented so that advantageously even an unintentional heating of additional electrical or electronic components 19 on the printed circuit board 1 by the waste heat of the heat source 10 transported via the heat conducting channels W may be prevented.

The routing channels R may be merged or bundled conductor structures via several printed circuit board layers 3 of the printed circuit board 1, i.e., for the conducting of the electrical currents in the printed circuit board 1, which may proceed from a controller representing the heat source 10 to the components 19. The components 19 may be formed as power supply, sensor interfaces, IGBTs, FETs or other components.

According to FIG. 4, the routing channels R and the heat conducting channels W may be distributed around the heating source 10 in an alternative way around an axis through the heat source 10 in direction A of the layer stack, so that an advantageously uniform cooling of the printed circuit board 1 may be possible via the heat conducting channels W, the vias 6 and 18 as well as the metalized front ends 5, 5', 5", 5'".

By means of a multilayer printed circuit board 1 as described previously as well as the arrangement 12, a controller, such as a motor vehicle or a transmission control device, may be formed advantageously.

As described above, the present application relates to multilayer printed circuit boards and devices comprising the multilayer printed circuit boards. It is intended that the foregoing detailed description be regarded as illustrative rather than limiting, and that it be understood that it is the following claims, including all equivalents, that are intended to define the spirit and scope of this invention.

In addition, while example embodiments have been particularly shown and described with reference to FIGS. 1-4, it will be understood by one of ordinary skill in the art that various changes in form and details may be made therein without departing from the spirit and scope of example embodiments, as defined by the following claims. The example embodiments, therefore, are provided merely to be illustrative and subject matter that is covered or claimed is intended to be construed as not being limited to any example embodiments set forth herein. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" or "in one example embodiment" as used herein does not necessarily refer to the same embodiment and the phrase "in another embodiment" or "in another example embodiment" as used herein does not necessarily refer to a different embodiment. It is intended, for example, that claimed subject matter include combinations of example embodiments in whole or in part.

The terminology used in the specification is for the purpose of describing particular embodiments only and is not intended to be limiting of example embodiments of the invention. In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Likewise, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof, and in the following description, the same reference numerals denote the same elements.

REFERENCE NUMBERS

1 Multilayer Printed Circuit Board
2 First surface
3 Printed circuit board layers
3a Thermally conductive layer
3b Substrate layer
4 Second surface
5, 5', 5", 5'" Metalized front end
5a Metalized coating
6 edge vias, Vias on the edge
7 Open end
8 Lateral surface or inner surface of the vias
9 Opening of the vias
10 Heat source
11 Group of vias
12 Arrangement
13 Housing body
14 Faces
15 Filler
16 Planar housing body surface
17 Binder
18 intermediate vias
19 Components
A Stacking direction
B,C Directions
R Routing channel
W Heat conducting channel
W' Heat flow

We claim:

1. An apparatus, comprising:
a multilayer printed circuit board comprising a plurality of printed circuit board layers;
a front end, being a thermal conductive layer, connecting a lateral surface of the multilayer printed circuit board for heat transfer; and
at least one edge via in the printed circuit board being thermally conductively contacted to the front end, wherein at least one heat conducting channel is formed extending from a heat source on the multilayer printed circuit board to the front end through the at least one edge via.

2. The apparatus according to claim 1, wherein the at least one edge via is one of a hollow cylinder and column, and a lateral inner surface of the edge via is formed on the lateral surface of the multilayer printed circuit board as a part of the front end.

3. The apparatus according to claim 1, wherein the at least one edge via is thermally conductively contacted to at least one of the plurality of printed circuit board layers.

4. The apparatus according to claim 1, wherein the at least one edge via comprises a plurality of edge vias, which are arranged in a plurality of groups spaced apart from one another, wherein the plurality of edge vias are each assigned to a group next to one another along the edge of the printed circuit board.

5. The apparatus according to claim 1, wherein the front end is copper-plated over its entire surface.

6. The apparatus according to claim 1, wherein the front end is formed by metal coating on the lateral surface of the printed circuit board.

7. The apparatus according to claim 1, wherein the at least one edge via penetrates through the plurality of printed circuit board layers.

8. An apparatus, comprising:
a multilayer printed circuit board comprising a plurality of printed circuit board layers;
a front end, being a thermal conductive layer, connecting a lateral surface of the multilayer printed circuit board for heat transfer; and
at least one edge via in the printed circuit board being thermally conductively contacted to the front end, wherein at least one heat conducting channel is formed extending from a heat source on the multilayer printed circuit board to the front end through the at least one edge via, wherein between the heat source and the at least one edge via at least one intermediate via is formed in the printed circuit board, which contributes to the formation of the at least one heat conducting channel.

9. An apparatus, comprising:
a multilayer printed circuit board comprising a plurality of printed circuit board layers;
a front end, being a thermal conductive layer, connecting a lateral surface of the multilayer printed circuit board for heat transfer;
at least one edge via in the printed circuit board being thermally conductively contacted to the front end, wherein at least one heat conducting channel is formed extending from a heat source on the multilayer printed circuit board to the front end through the at least one edge via; and
at least one routing channel, wherein the at least one routing channel and the at least one heat conducting channel are configured to de-concentrate thermal and electric currents.

10. An apparatus, comprising:
a multilayer printed circuit board comprising a plurality of printed circuit board layers;
a front end, being a thermal conductive layer, connecting a lateral surface of the multilayer printed circuit board for heat transfer;
at least one edge via in the printed circuit board being thermally conductively contacted to the front end, wherein at least one heat conducting channel is formed extending from a heat source on the multilayer printed circuit board to the front end through the at least one edge via; and
at least one routing channel, wherein the at least one routing channel and the at least one heat conducting channel are configured to de-concentrate thermal and electric currents, wherein the at least one heat conducting channel and the at least one routing channel are distributed in an alternative way around a heat source.

11. The apparatus according to claim 1, further comprising
a housing body, in which the multilayer printed circuit board is arranged; and
a thermally conductive filler between the front end and the housing body.

12. An apparatus, comprising:
a multilayer printed circuit board comprising a plurality of printed circuit board layers;
a front end, being a thermal conductive layer, connecting a lateral surface of the multilayer printed circuit board for heat transfer;
at least one edge via in the printed circuit board being thermally conductively contacted to the front end;
a housing body, in which the multilayer printed circuit board is arranged; and
a thermally conductive filler between the front end and the housing body, wherein the at least one thermal conductive via is filled with the thermally conductive filler, thereby thermally conductively contact the housing body.

13. An apparatus, comprising:
a multilayer printed circuit board comprising a plurality of printed circuit board layers;
a front end, being a thermal conductive layer, connecting a lateral surface of the multilayer printed circuit board for heat transfer;
at least one edge via in the printed circuit board being thermally conductively contacted to the front end;
a housing body, in which the multilayer printed circuit board is arranged; and
a thermally conductive filler between the front end and the housing body, wherein the at least one thermal conductive via is filled with the thermally conductive filler, thereby thermally conductively contact the housing body, wherein an open end of the at least one thermal conductive via is covered by a pressing element fixed on the housing body.

14. The apparatus according to claim 11, wherein the housing body is a metal housing body.

15. The apparatus according to claim 1, further comprising at least one of a motor vehicle and a transmission control device.

16. The apparatus according to claim 1, wherein the thermal conductive layer is a metal layer.

17. The apparatus according to claim 11, wherein the thermal conductive filler is heat sink paste.

18. An apparatus, comprising:
a multilayer printed circuit board comprising a plurality of printed circuit board layers;
a front end, being a thermal conductive layer, connecting a lateral surface of the multilayer printed circuit board for heat transfer;
at least one edge via in the printed circuit board being thermally conductively contacted to the front end;
a housing body, in which the multilayer printed circuit board is arranged; and
a thermally conductive filler between the front end and the housing body, wherein the at least one thermal conductive via is filled with the thermally conductive filler, thereby thermally conductively contact the housing body, wherein an open end of the at least one thermal conductive via is covered by a pressing element fixed on the housing body, wherein the pressing element is a binder.

19. The apparatus according to claim 14, wherein the housing body is an aluminum die cast body.

* * * * *